United States Patent [19]

Sawada

[11] Patent Number: 6,014,340
[45] Date of Patent: Jan. 11, 2000

[54] SYNCHRONOUS SEMICONDUCTOR MEMORY DEVICE HAVING INTERNAL CIRCUITRY ENABLED ONLY WHEN COMMANDS ARE APPLIED IN NORMAL SEQUENCE

[75] Inventor: Seiji Sawada, Hyogo, Japan

[73] Assignee: Mitsubishi Denki Kabushiki Kaisha, Tokyo, Japan

[21] Appl. No.: 08/978,440

[22] Filed: Nov. 25, 1997

Related U.S. Application Data

[63] Continuation of application No. 08/768,081, Dec. 16, 1996, Pat. No. 5,703,831.

[30] Foreign Application Priority Data

Dec. 19, 1995 [JP] Japan ................................. 7-330393

[51] Int. Cl.$^7$ ..................................................... G11C 7/00
[52] U.S. Cl. ........................................... 365/233; 365/191
[58] Field of Search .................................. 365/191, 193, 365/203, 230.06, 233

[56] References Cited

U.S. PATENT DOCUMENTS

| | | | |
|---|---|---|---|
| 5,014,245 | 5/1991 | Muroka | 365/194 |
| 5,311,483 | 5/1994 | Takasugi | 365/233 |
| 5,448,528 | 9/1995 | Nagai | 365/233 |
| 5,530,677 | 6/1996 | Grover | 365/233 |
| 5,559,752 | 9/1996 | Stephens, Jr. et al. | 365/233 |
| 5,774,402 | 6/1998 | Lee | 365/191 |

FOREIGN PATENT DOCUMENTS 195 13 587
A1    10/1995    Germany.

*Primary Examiner*—Son Mai
*Attorney, Agent, or Firm*—McDermott, Will & Emery

[57] ABSTRACT

In a synchronous semiconductor memory device in which contents of an internal operation is designated by commands applied in synchronization with a clock signal, operations of decoding read, write and precharge commands different from an active command for activating the internal operation are enabled only when the active command is active. Even if a command such as read command other than the active command is applied during an inactive state of internal circuits, other command decoder cannot perform the decoding, so that unnecessary circuit operation can be prevented.

16 Claims, 13 Drawing Sheets

: BANK#A IS DESIGNATED BY BA = "L (=0)"

SYNCHRONOUS SEMICONDUCTOR MEMORY DEVICE HAVING INTERNAL CIRCUITRY ENABLED ONLY WHEN COMMANDS ARE APPLIED IN NORMAL SEQUENCE

This application is a continuation of application Ser. No. 08/768,081 filed Dec. 16. 1996, U.S. Pat. No. 5,703,831.

BACKGROUND OF THE INVENTION

1. Field of the Invention

The present invention relates to a synchronous semiconductor memory device, and in particular to a structure which determines states of externally applied control signals to identify a designated internal operation.

2. Description of the Background Art

In accordance with increase of an operation speed of CPUs (Central Processing Units), i.e., external processing units, it has been demanded to increase an operation speed of DRAMs (Dynamic Random Access Memories) used as system memories of main storage units. As a memory satisfying the above demand for the high speed operation, there has been a synchronous semiconductor memory device which operates in synchronization with an external clock signal such as a system clock. The synchronous semiconductor memory device (which will also be referred to as an SDRAM (Synchronous Dynamic Random Access Memory) determines the states of external signals, e.g., at the time of rising of an external clock signal, decides the internal operation to be executed in accordance with the result of determination, and executes the decided internal operation. Since the states of external control signals are determined at the time of rising of the external clock signal (which will be referred to as a clock signal), it is not necessary to take into consideration a margin with respect to skew of the external control signals, for example, so that the internal operation can be started at an earlier timing, and therefore high-speed access can be achieved. Since input/output of data are performed in synchronization with the clock signal, the input/output of data can be performed rapidly.

In the above SDRAM, the external control signals are in a pulse form. Since the external control signals have the same pulse form as the clock signal, it is only necessary to generate the external control signals in synchronization with the clock signal, so that control by the external control device can be made easy. Since the skew of the external control signal is the same as that of the clock signal, it is not necessary to take into consideration a margin for a set-up time and a hold time of the external control signal with respect to the clock signal, so that an internal operation can be started faster. In SDRAM including banks which operate independently from each other, the external control signals in the pulse form allow activation of one of the banks while another bank is active. Therefore, the banks can be alternately activated and accessed. This results in that an RAS precharge period (period required from deactivation of a row address strobe signal ZRAS to subsequent activation) which is required in a standard DRAM is hidden from the external, so that input/output of data can be performed at high speed.

FIG. 11 shows a relationship between designated internal operations and states of the external control signals in the SDRAM.

Since designation of the internal operation mode is made with a plurality of external control signals, a set of states of the external control signals will be referred to as a "command".

The external control signals to be used are specifically a row address strobe signal extZRAS, an external column address strobe signal extZCAS and an external write enable signal extZWE.

[NOP Command]

In FIG. 11, if all of external control signals extZRAS, extZCAS and extZWE are held at H-level when an externally applied clock signal extCLK rises at time T0, an internal operation is not designated. The state of the last cycle is maintained in the SDRAM.

[Read Command]

When clock signal extCLK rises at time T1 in FIG. 11, both control signals extZRAS and extZWE are set to H-level, and column address strobe signal extZCAS is set to L-level. This combination of the states of external control signals is called a read command, which designates output (read) of data in the SDRAM. When this read command is received, an internal column address strobe signal CAS0, which activates the column selection operation in the SDRAM, is activated. This signal CAS0 is in the one-shot pulse form, and is used as a trigger signal. In order to activate the data reading, a read trigger (read instruction) signal ZR is set active for a predetermined period.

[Write Command]

When clock signal extCLK rises at time T2 in FIG. 11, external row address strobe signal extZRAS is set to H-level, and both external control signals extZCAS and extZWE are set to L-level. This state is called a write command, which designates the writing of data into the SDRAM. When the write command is received, internal column address strobe signal CAS0, which functions as a trigger signal for activating the column select operation in the SDRAM, is activated. Also, internal write enable signal WE0 designating the internal data writing is activated. In response to internal write enable signal WE0, a write instruction signal ZW for triggering the writing of data into the SDRAM is activated.

[Precharge Command]

When clock signal extCLK rises at time T3 in FIG. 11, both external control signals extZRAS and extZWE are set to L-level, and column address strobe signal extZCAS is set to H-level. This state is called a precharge command, by which an operation is performed to set internally the SDRAM to a precharge state (standby state). When the precharge command is applied, internal row address strobe signal RAS0 and internal write enable signal WE0 are set active for a predetermined period, and a precharge trigger signal ZPC for triggering the precharge operation is set active for a predetermined period.

[Active Command]

When clock signal extCLK rises at time T4 in FIG. 11, row address strobe signal extZRAS is set to L-level, and both external control signals extZCAS and extZWE are set to H-level. This state is called an active command, by which a memory cell selection operation in the SDRAM is activated. When this active command is received, internal row address strobe signal RAS0 is activated, and thereby an active trigger (instruction of start of internal operation) signal ZA for activating the memory cell selection operation is set active for a predetermined period.

FIG. 12 schematically shows a structure of an external control signal input selection. In FIG. 12, there are arranged a RAS input buffer 1a, a CAS input buffer 1b and a WE input buffer 1c, which correspond to external control signals extZRAS, extZCAS and extZWE and produce one shot internal control signals RAS0, CAS0 and WE0 in synchronization with clock signal CLK, respectively. These input buffers 1a, 1b and 1c set the related internal control signals to H-level for a predetermined period when the corresponding external control signals are at L-level at the time of rising of clock signal CLK.

There are arranged inverters 3a–3c corresponding to input buffers 1a–1c for producing inverted signals ZRAS0, ZCAS0 and ZWE0 of internal control signals RAS0, CAS0 and WE0, respectively. Internal control signals RAS0, CAS0 and WE0 from input buffers la-ic as well as the inverted signals of these internal control signals are applied to a command decoder 4.

Command decoder 4 sets trigger signals ZA, ZR, ZW and ZPC to the active state for a predetermined period to activate a required internal operation in accordance with combination of states of the applied internal control signals.

FIG. 13A schematically shows a structure of input buffer 1 (1a–1c) shown in FIG. 12. Input buffers 1a–1c have the same structure. In FIG. 13A, the external control signal is indicated by reference characters EXT, and the external control signal is indicated by reference characters INT.

In FIG. 13A, input buffer 1 (1a–1c) includes an inverter 5 receiving external control signal EXT, an NAND circuit 6 receiving the output signal of inverter 5 and clock signal CLK, and a pulse generator 7 which generates a pulse in response to falling of the output signal of NAND circuit 6. Pulse generator 7 generates internal control signal INT in a pulse form which attains H-level for a predetermined period. Operation of the input buffer shown in FIG. 13A will be described below with reference to a waveform diagram of FIG. 13B.

When clock signal CLK is at L-level, the output signal of NAND circuit 6 is fixed at H-level. When external control signal EXT is at H-level, the output signal of inverter 5 is at L-level, and the output signal of NAND circuit 6 is held at H-level. In this state, pulse generator 7 generates no pulse, and internal control signal INT is maintained at the inactive state of L-level.

If external control signal EXT is at L-level when clock signal CLK rises, the output signal of NAND circuit 6 falls to L-level in response to this rising of clock signal CLK. In response to falling of the output signal of NAND circuit 6, pulse generator 7 holds internal control signal INT at H-level for a predetermined period. Deactivation of internal control signal INT generated from pulse generator 7 may be done in accordance with a timing which is determined in advance in pulse generator 7, or may be done in synchronization with falling of clock signal CLK.

FIG. 14 schematically shows a structure of command decoder 4 shown in FIG. 12. As shown in FIG. 14, command decoder 4 is formed of NAND-type decoder circuits which are provided corresponding to the internal trigger signals. More specifically, active operation trigger signal ZA is generated from an NAND circuit 4a receiving internal control signals RAS0, ZCAS0 and ZWE0. Read operation trigger signal ZR is generated from an NAND circuit 4b receiving internal control signals ZRAS0, CAS0 and ZWE0. Write operation trigger signal ZW is generated from an NAND circuit 4c receiving internal control signals ZRAS0, CAS0 and WE0. Precharge operation trigger signal ZPC is generated from an NAND circuit 4d receiving internal control signals RAS0, ZCAS0 and WE0.

In accordance with these trigger signals from the command decoder, a control circuit (not shown) operates to execute a designated internal operation.

Owing to the structures of input buffers and command decoder described above, the trigger signal for an internal operation is output in synchronization with clock signal CLK for starting the internal operation. As shown in FIG. 14, however, the trigger signals for the respective operation modes are generated from NAND circuits 4a–4d which are arranged in parallel with each other. NAND circuits 4a–4d each generate the corresponding trigger signal in accordance with the states of applied internal control signals regardless of the states of the other trigger signals.

In the SDRAM, when the active command is supplied, the internal precharge state (standby state) is released, and the memory cell selection operation starts. In order to read or write data of memory cells, therefore, it is necessary to supply the commands in the order of (1) active command, (2) read command or write command, and (3) precharge command.

Therefore, even when the read command, write command or precharge command is supplied, the SDRAM does not accurately perform the designated internal operation unless the active command is supplied. When the active command is not supplied, selection of memory cells is not performed, so that a selected memory cell does not exist, and therefore the normal data reading cannot be performed even if the read command is applied. In this case, the I/O circuit is enabled by the trigger signal produced in accordance with the read command or write command.

Usually, the write, read or precharge command is not supplied without supplying the active command. However, in the case of an erroneous sequence (supply of a command other than the active command prior to supply of the active command), a signal triggering an operation corresponding to the supplied command is activated in accordance with the supplied command even if the active command is inactive, as shown in FIG. 13A and FIG. 14. Therefore, circuits operate unnecessarily, resulting in increase of power consumption. Also, internal circuits of the SDRAM may malfunction in accordance with the erroneously activated trigger signal.

SUMMARY OF THE INVENTION

An object of the invention is to provide a synchronous semiconductor memory device which can prevent unnecessary circuit operation and thereby can reduce power consumption.

Another object of the invention is to provide a synchronous semiconductor memory device which can inhibit a circuit operation which is probable to be performed in accordance with an erroneously supplied command, i.e., a command supplied in an erroneous sequence.

A synchronous semiconductor memory device according to a first aspect of the invention includes a first command decoder for determining states of a plurality of external control signals applied externally in synchronization with an externally and periodically applied clock signal, and activating a predetermined internal operation when a first combination of states of the external control signals is found, and a second command decoder being enabled in response to an activating signal from the first command decoder to determine the states of the plurality of external control signals in synchronization with the clock signal and activate a second internal operation different from the predetermined internal operation when a second combination of states of the plurality of external control signals different from the first combination of states is found.

A synchronous semiconductor memory device according to a second aspect of the invention includes a command register for storing data defining an operation form of the synchronous semiconductor memory device, a plurality of memory cells, a first command decoder for determining states of control signals applied externally in synchronization with an externally and periodically applied clock signal, and activating an operation of selecting memory cells among the plurality of memory cells when a first combination of states of the plurality of external control signals is found, and a second command decoder for determining the states of the external control signals in synchronization with the clock signal, and activating an operation mode for storing the data defining the operation form in the command register when a second combination of states of the external control signals is found. The second command decoder includes a circuit for inhibiting a determining operation of the first command decoder and thereby deactivating the selection operation for the plurality of memory cells when the second combination of states of the applied external control signals is found.

Since the command decoder circuit is enabled only when an internal operation to be performed in accordance with an input command is valid, i.e., only when the commands are applied in a normal sequence allowing the internal operation to be performed normally, it is possible to prevent operation of the internal circuit when a command is applied in an erroneous sequence, so that power consumption is reduced, and malfunction is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
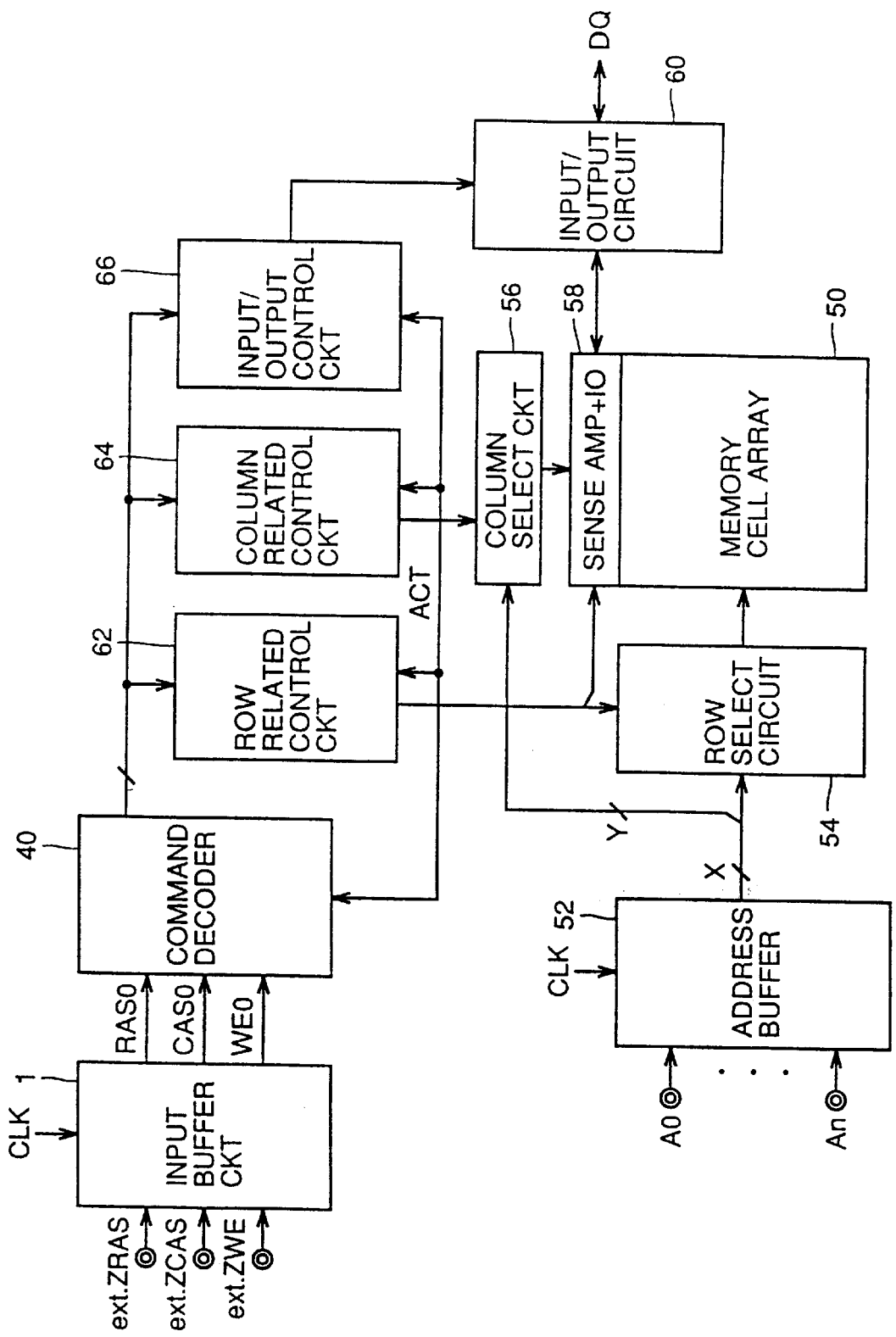
FIG. 1 schematically shows a whole structure of a synchronous semiconductor memory device according to a first embodiment of the invention.

FIG. 1 schematically shows a whole structure of an SDRAM according to a first embodiment of the invention. In FIG. 1, the SDRAM includes a memory cell array 50 having a plurality of memory cells (dynamic memory cells; memory cells each formed of one capacitor and one transistor) arranged in a matrix form, an address buffer 52 which takes in externally applied address signal bits A0–An in synchronization with a clock signal CLK and produces an internal address signal, a row select circuit 54 which decodes an internal row address signal X applied from address buffer 52 and selects a row in memory cell array 50, a column select circuit 56 which decodes an internal column address signal Y applied from address buffer 52 and selects a column in memory cell array 50, sense amplifiers for sensing and amplifying data of the memory cells connected to the selected row in memory cell array 50, and I/O gates for connecting the selected column to I/O (input/output) circuit 60 in response to a column select signal from column select circuit 56. In FIG. 1, the sense amplifiers and the I/O gates are represented as one block 58. When I/O circuit 60 is active, it performs input/output of data DQ in synchronization with clock signal CLK.

For control of the internal operation, the SDRAM includes an input buffer circuit 1 which takes in externally applied external control signals extZRAS, extZCAS and extZWE in synchronization with clock signal CLK for producing internal control signals RAS0, CAS0 and WE0, a command decoder 40 which generates a trigger signal for triggering the internal operation in accordance with internal control signals RAS0, CAS0 and WE0 applied from input buffer circuit 1, a row-related control circuit 62 which is activated in response to a row select operation trigger signal applied from command decoder 40 and controls activation of row select circuit 54 and the sense amplifiers, a column-related control circuit 64 which is activated in response to a column select operation trigger signal applied from command decoder 40 and controls activation of portions related to column selecting operation such as precharge of column select circuit 56 and an internal data bus line as well as amplification of an unillustrated preamplifier, and an I/O (input/output) control circuit 66 which is activated in response to the trigger signal for data I/O operation applied from command decoder 40 and controls the operation of I/O circuit 60.

When command decoder 40 detects the active command, row-related control circuit 62 responds to the internal activation trigger signal applied from command decoder 40, to apply an active signal ACT activating the internal operation to command decoder 40, column-related control circuit 64 and I/O control circuit 66. In command decoder 40, as will be described later, a portion decoding commands other than the active command is enabled (i.e., activated) only when active signal ACT is active. Similarly, column-related control signal 64 and I/O control circuit 66 are activated only when active signal ACT applied from row-related control circuit 62 is active.

Clock signal CLK shown in FIG. 1 may be an externally applied external clock signal extCLK or an internally buffered internal clock signal.

As shown in FIG. 1, command decoder 40 is enabled to decode commands other than the active command only when active signal ACT is activated. Thereby, when a command is supplied in an erroneous sequence, it is possible to stop operation of the decoder circuit portion other than the active command decoder portion, so that the power consumption can be reduced, and malfunction of the memory device due to unnecessary circuit operation can be prevented. By enabling column-related control circuit 64 and I/O control circuit 66 in accordance with active signal ACT, it is possible to prevent malfunction of the internal circuits when a command is supplied in a sequence other than the normal sequence (input of the read, write or precharge command after input of the active command), and thus reliability of the SDRAM can be ensured.

Figure 2A:
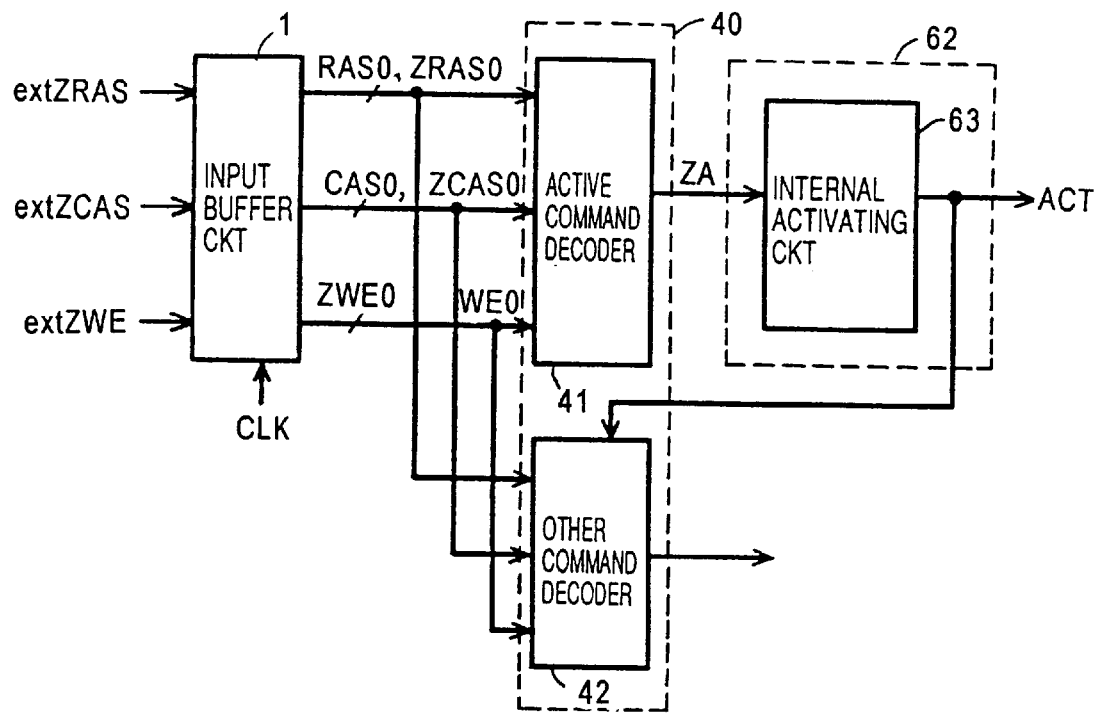
FIG. 2A schematically shows structures of a command decoder and a row-related control circuit.
Figure 12:
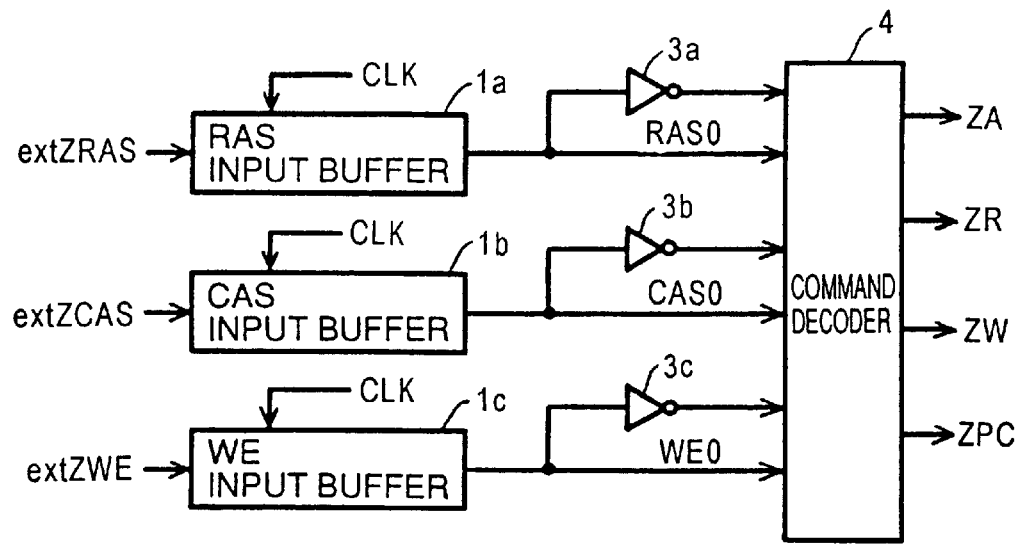
FIG. 12 schematically shows a structure of an external control signal input section of the conventional SDRAM.
Figure 13A:
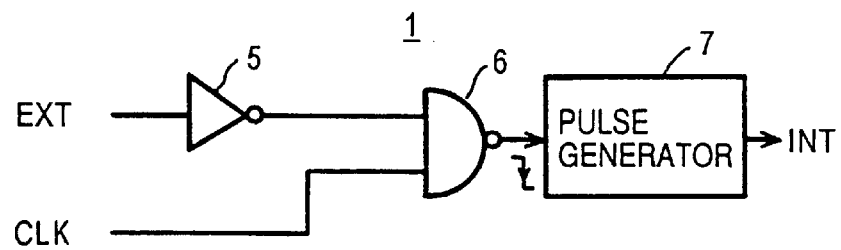
FIG. 13A shows a structure of an input buffer shown in FIG. 12.
Figure 13B:
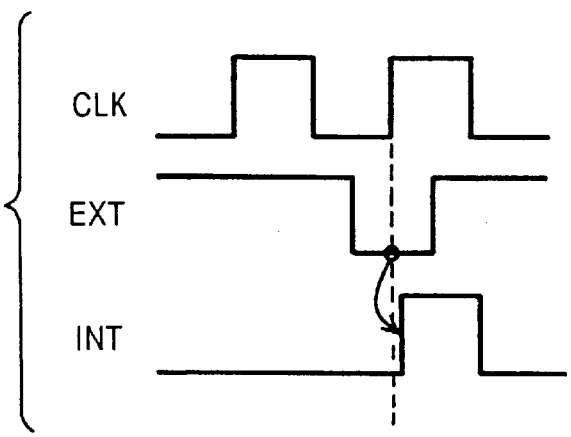
FIG. 13B is a waveform diagram representing an operation thereof.

FIG. 2A schematically shows structures of command decoder 40 and row-related control circuit 62 shown in FIG. 1. Input buffer circuit 1 has the structure shown in FIGS. 12 and 13, and operates in synchronization with rising of clock signal CLK to take in external control signals extZRAS, extZCAS and extZWE and produce complementary internal control signals RAS0, ZRAS0, CAS0, ZCAS0, WE0 and ZWE0 for applying them to command decoder 40.

Command decoder 40 includes an active command decoder 41 which operates in accordance with the states of internal control signals applied from input buffer circuit 1 to determine whether the active command is applied or not, and other command decoder 42 for detecting the fact that a command other than the active command is applied. Active command decoder 41 generates internal operation activation trigger signal ZA.

Row-related control circuit 62 includes an internal activating circuit 63, which activates internal operation activating signal (active signal) ACT in response to activation of internal operation activation trigger signal ZA applied from active command decoder 41. In response to activation of active signal ACT, row-related control circuit 62 sequentially activates row select circuit 54 and the sense amplifiers (see FIG. 1) in a predetermined sequence.

Active signal ACT from internal activating circuit 63 is applied to command decoder 42. Other command decoder 42 is activated (enabled) to decode the internal control signals applied from input buffer circuit 1 only when active signal ACT is active, and determines whether one of the commands is applied or not.

By enabling other command decoder 42 only when active signal ACT is active, unnecessary circuit operation can be inhibited as follows, even if a command is supplied in an erroneous sequence, i.e., even in such a case that a command other than the active command is supplied before supply of the active command. In the above case, since other command decoder 42 is inactive (i.e., disabled), it does not decode any internal control signal applied from input buffer circuit 1, so that generation of a trigger signal corresponding to the command applied in an erroneous sequence is prevented, and thus unnecessary circuit operation is inhibited.

Figure 2B:
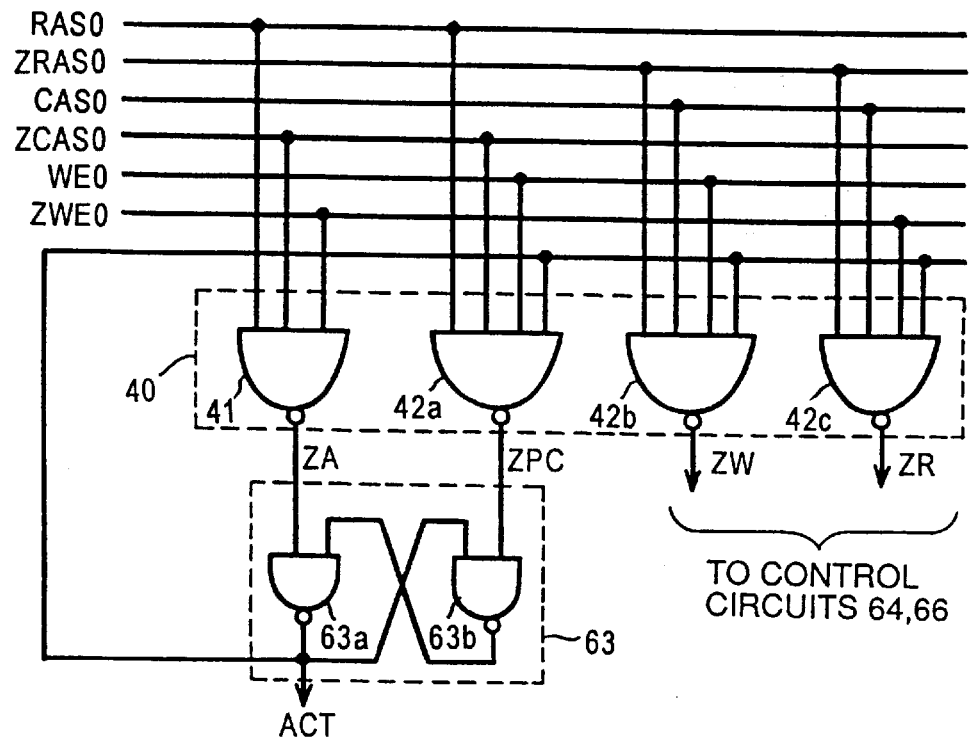
FIG. 2B specifically shows structures of an active command decoder, other command decoders and an internal activating circuit.

FIG. 2B shows an example of specific structures of command decoder 40 and internal activating circuit 63 shown in FIG. 2A. In FIG. 2B, active command decoder circuit 41 is formed of a 3-input NAND circuit receiving internal control signals RAS0, ZCAS0 and ZWE0. Other command decoder 42 includes a precharge command decoder circuit 42a, a write command decoder circuit 42b and a read command decoder circuit 42c.

Precharge command decoder circuit 42a is formed of a 4-input NAND circuit receiving internal control signals RAS0, ZCAS0 and WE0 and also receiving active signal ACT. Write command decoder circuit 42b is formed of a 4-input NAND circuit receiving internal control signals ZRAS0, CAS0 and WE0 and also receiving active signal ACT. Read command decoder circuit 42c is formed of a 4-input NAND circuit receiving internal control signals ZRAS0, CAS0 and ZWE0 and also receiving active signal ACT.

Internal activating circuit 63 is formed of an NAND type flip-flop, which receives internal operation activation trigger signal ZA applied from active command decoder 41 on its set input, and receives precharge operation trigger signal ZPC from precharge command decoder 42a on its reset input. The NAND-type flip-flop includes an NAND circuit 63a receiving trigger signal ZA on one of its two inputs, and an NAND circuit 63b receiving trigger signal ZPC on one of its two inputs. The output of NAND circuit 63b is applied to the other input of NAND circuit 63a, which in turn generates active signal ACT from its output. Active signal ACT is also applied to the other input of NAND circuit 63b.

Figure 3:
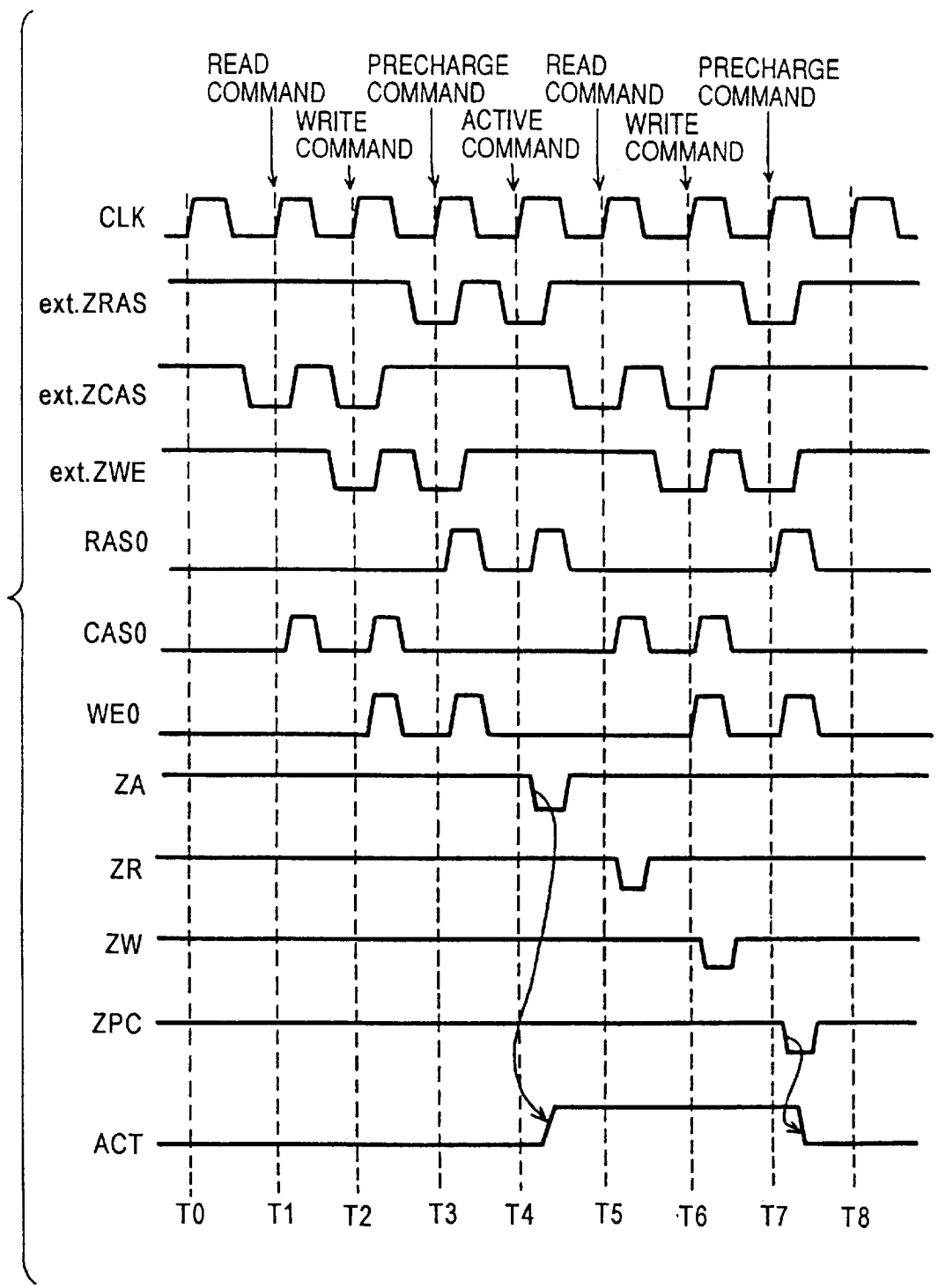
FIG. 3 is a timing chart representing an operation of an SDRAM according to the first embodiment of the invention.

Operation of the circuits shown in FIG. 2B will be described below with reference to a timing chart of FIG. 3.

If all external control signals extZRAS, extZCAS and extZWE are at H-level when clock signal CLK rises at time T0, each of command decoder circuits 41 and 42a–42c receives on at least one of its inputs a signal at L-level, and therefore generated a signal at H-level, and the internal circuits maintain the state of the last cycle. In FIG. 3, active signal ACT is at L-level, and the SDRAM maintains the precharge state (standby state).

When clock signal CLK rises at time T1, external control signal extZCAS is set to L-level, and both external control signals extZRAS and extZWE are set to H-level, so that the read command is applied. Internal control signal CAS0 is set to H-level for a predetermined period. However, active signal ACT maintains L-level, all the output signals of command decoder circuits 42a–42c are at H-level, and signals for triggering the read operation maintain the inactive state.

When clock signal CLK rises at time T2, external control signal extZRAS is set to H-level, both external control signals extZCAS and extZWE are set to L-level, and the write command is applied. Although internal control signals CAS0 and WE0 are set to the active state of H-level for a predetermined period, active signal ACT is still at the inactive state of L-level even in this state, and trigger signal ZW for triggering the write operation maintains the inactive state of H-level.

When clock signal CLK rises at time T3, both external control signals extZRAS and extZWE are set to L-level, external control signal extZCAS is set to H-level, and the precharge command is applied. In this case, internal control signals RAS0 and WE0 are set to H-level for a predetermined period, but active signal ACT is at L-level even in this state, and all trigger signals ZA, ZR and ZW maintain the inactive state.

When clock signal CLK rises at time T4, external control signal extZRAS is set to L-level, both external control signals extZCAS and extZWE are set to H-level, and the active command is applied. In response to this active command, internal control signal RAS0 is set to H-level, while internal control signals CAS0 and WE0 are held at L-level. In this state, trigger signal ZA from active command decoder 41 is held at L-level for a predetermined period, internal activating circuit 63 is set, and active signal ACT is set to H-level. In accordance with this activation of active signal ACT, the internal operation of selecting the memory cells starts. In response to the activation of active signal ACT to H-level, all command decoder 42a–42c are enabled.

When clock signal CLK rises at time T5, both external control signals extZRAS and extZWE are held at H-level, external control signal extZCAS is set to L-level, and the read command is applied. In this state, internal control signal CAS is set to H-level for a predetermined period, and internal control signals RAS0 and WE0 are held at L-level. In response to the read command, read command decoder circuit 42c sets read operation trigger signal ZR to the active state of L-level for a predetermined period. In accordance with the activated read operation trigger signal ZR, column-related control circuit 64 and I/O control circuit 66 are activated, so that the column select operation and data output operation are executed in a predetermined sequence.

When clock signal CLK rises at time T6, external control signal extZRAS is set to H-level, both external control signals extZCAS and extZWE are set to L-level, and the write command is applied. Internal control signal RAS0 is at L-level, internal control signals CAS0 and WE0 are at H-level, and write operation trigger signal ZWE from write command decoder circuit 42b is set to the active state of L-level for a predetermined period. In accordance with activated trigger signal ZW, column-related control circuit 64 and I/O control circuit 66 are successively activated, and the writing of data is executed.

When clock signal CLK rises at time T7, external control signals extZRAS and extZWE are set to L-level, external control signal extZCAS is set to H-level, and the precharge command is applied. Internal control signals RAS0 and WE0 are set to H-level, internal control signal CAS0 is at L-level, and precharge operation trigger signal ZPC from precharge command decoder circuit 42a is set to the active state of L-level for a predetermined period. In response to the activation of precharge operation trigger signal ZPC, internal activating circuit 63 is reset, and active signal ACT is deactivated to attain L-level. In response to this deactivation of active signal ACT, row-related control circuit 62, column-related control circuit 64 and I/O control circuit 66 shown in FIG. 1 are reset, and the SDRAM returns to the precharge state (standby state). Also, in response to the deactivation of active signal ACT, command decoder circuits 42a–42c are disabled, and thus the decoding is inhibited.

As described above, the trigger signals are generated such that the reading, writing or precharging is performed only when the read, write or precharge command is applied after the active command is applied. Owing to this, the read, write or precharge command, which is applied during the standby (precharge state) of the SRAM, cannot activate the corresponding trigger signal, so that unnecessary circuit operation can be prevented, and thus it is possible to reduce power consumption and prevent circuit malfunction.

In the above embodiment, all the read, write and precharge commands are accepted after the active command is applied to activate the SDRAM. Alternatively, such a structure may be employed that only one or two of the read, write and precharge commands can be accepted only during the active state of the SDRAM (i.e., only after application of the active command).

Internal activating signal ACT may be adapted to be applied from row-related control circuit 62 (internal activating circuit 63) to command decoder 40.

According to the first embodiment of the invention, as described above, the trigger signal for performing the internal circuit operation is activated only when the commands are applied in a normal sequence. Therefore, unnecessary circuit operation can be prevented when an inexecutable command is applied, so that the power consumption can be reduced, and the malfunction of circuits can be prevented.

[Embodiment 2]

Figure 4A:
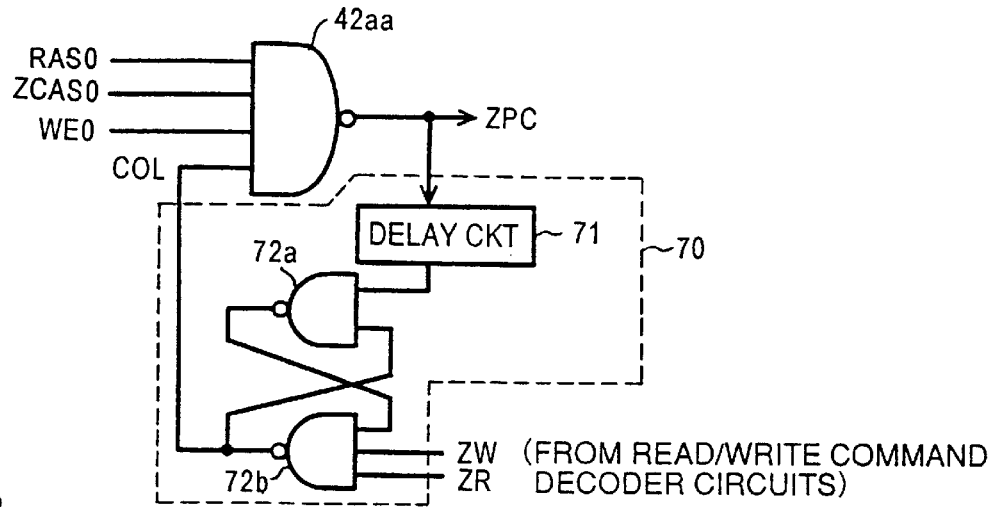
FIG. 4A shows a structure of a main portion of an SDRAM according to a second embodiment of the invention.

FIG. 4A shows a structure of a main portion of an SDRAM according to a second embodiment of the invention. More specifically, FIG. 4A shows only a structure of a portion decoding the precharge command. In FIG. 4A, a precharge command decoder circuit 42aa is formed of a 4-input NAND circuit which receives internal control signals RAS0, ZCAS and WE0 as well as a column selection execution instructing signal COL. Column selection execution instructing signal COL is applied from a column selection execution detecting circuit 70. Column selection execution detecting circuit 70 is formed of a flip-flop including NAND circuits 72a and 72b, which is set when one of read operation trigger signal ZR and write operation trigger signal ZW is activated, and is reset when precharge operation trigger signal ZPC is activated.

Figure 4B:
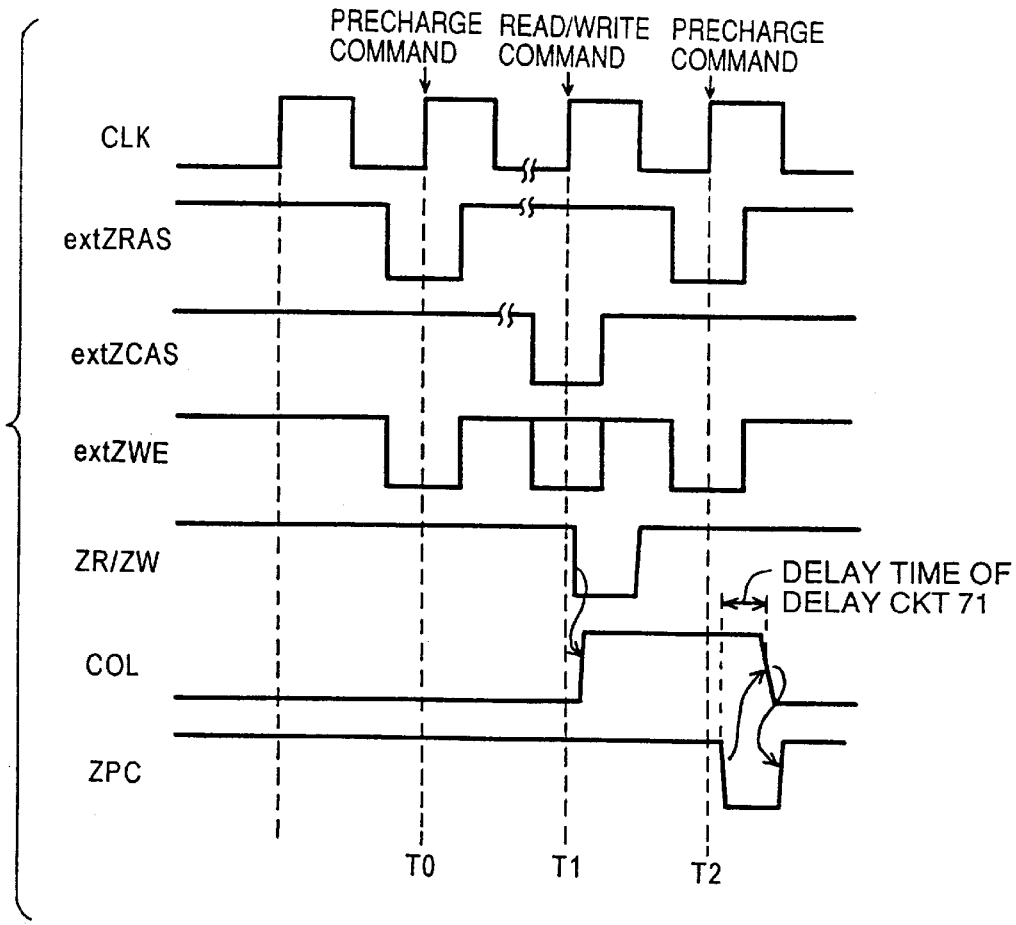
FIG. 4B is a timing chart representing an operation of a precharge command decoder circuit shown in FIG. 4A.

NAND circuit 72a receives a delayed trigger signal from a delay circuit 71 delaying precharge operation trigger signal ZPC for a predetermined time, and also receives the output signal of NAND circuit 72b. NAND circuit 72b supplies column selection execution detecting signal COL. NAND circuit 72b receives the output signal of NAND circuit 72a as well as read operation trigger signal ZR and write operation trigger signal ZW. Now, operation of the precharge command decoder circuit shown in FIG. 4A will be described below with reference to a timing chart of FIG. 4B.

When clock signal CLK rises at time T0, both external control signals extZRAS and extZWE are set to L-level, external control signal extZCAS is set to H-level, and the precharge command is applied. In this state, neither the read command nor the write command is applied, and neither the column selection nor the input/output of data is performed, so that column selection execution detecting signal COL attains L-level, and precharge operation trigger signal ZPC is held at H-level. The circuit receiving precharge operation trigger signal ZPC does not operate.

When clock signal CLK rises at time T1, external control signal extZRAS is set to H-level, and external control signal extZCAS is set to L-level. External control signal extZWE is set to H-level or L-level in accordance with the operation (read operation or write operation) to be designated. Thus, the read or write command is applied at time T1. In accordance with the read or write command, column selection execution detecting signal COL from NAND circuit 72b attains H-level. In this state, since the read or write command, i.e., command other than the precharge command is applied, precharge operation trigger signal ZPC maintains H-level.

When clock signal CLK rises at time T2, both external control signals extZRAS and extZWE are set to L-level, external control signal extZCAS is set to H-level, and the precharge command is applied. In this state, all the inputs of precharge command decoder circuit 42aa are at H-level, so that it sets precharge operation trigger signal ZPC to the active state of L-level for a predetermined period. Thereby, internal active signal ACT is reset, and the precharge operation is internally executed. When a delay time determined by delay circuit 71 elapses after falling of precharge operation trigger signal ZPC, the output signal of NAND circuit 72a attains H-level, so that all the inputs of NAND circuit 72b attain H-level, and column selection execution detecting signal COL attains L-level. In response to falling of column selection execution detecting signal COL, precharge operation trigger signal ZPC rises to H-level. Owing to the delay time provided by delay circuit 71, it is possible to ensure a time for which the precharge operation trigger signal ZPC is active.

Usually, in the SDRAM, the precharge command is applied for returning the SDRAM to the precharge state (standby state) after completion of internal writing or reading of data. Therefore, by employing such a structure that precharge operation trigger signal ZPC is activated only when the precharge command is applied after the read or write command is applied, the precharge command operation trigger signal can always be set to the inactive state in such a case that the precharge command is supplied in an erroneous sequence (i.e., prior to the read or write command), and thus unnecessary circuit operation can be prevented.

Portions forming the other command decoder circuits may employ the same structures as those of the first embodiment. Such a structure may be employed that the active command decoder circuit, read command decoder circuit and write command decoder circuit perform the command decoding independently from each other, as is done in the prior art. Internal activating signal ACT may not be supplied to the column-related control circuit and I/O control circuit.

According to the second embodiment of the invention, as described above, the precharge command becomes valid only when it is applied after the read or write command is applied and the column selection is internally performed. Therefore, it is possible to prevent unnecessary circuit operation even if the precharge command is erroneously applied, so that circuit malfunction can be prevented and the power consumption can be reduced.

[Embodiment 3]

Figure 5A:
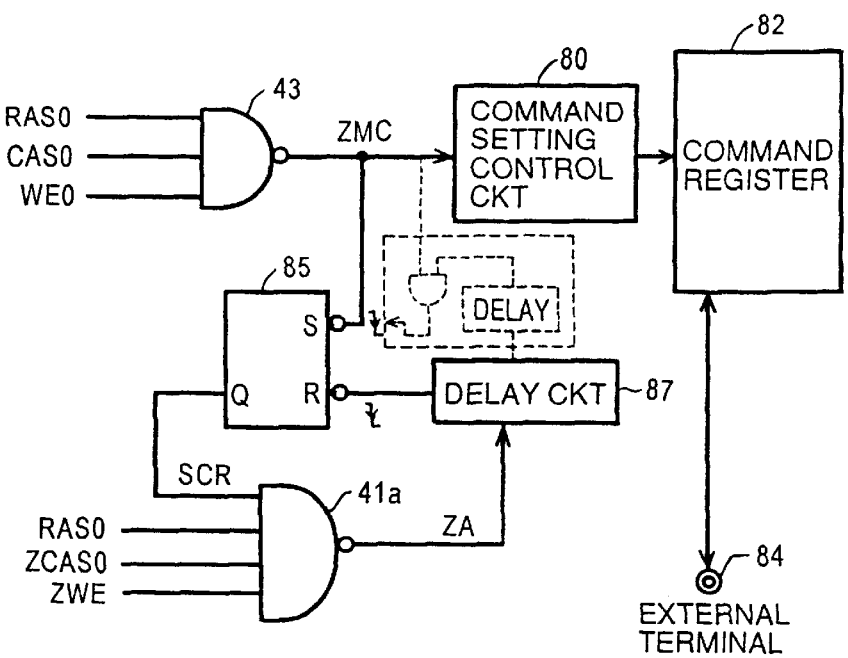
FIG. 5A shows a structure of a main portion of an SDRAM according to a third embodiment of the invention.

FIG. 5A shows a structure of a main portion of an SDRAM according to a third embodiment of the invention. In the structure shown in FIG. 5A, the SDRAM includes a command register 82 which stores data indicative of a burst length, a CAS latency, a burst type and others. The burst length indicates the number of data which can be continuously input/output by one internal access operation. The CAS latency indicates the number of cycles of clock signal CLK which are required from application of the read command to output of the valid data. The burst type indicates a sequence of change of the column address which successively changes at the time of continuous input/output of data. Usually, the burst type can be classified into two types, i.e., a sequential burst type according to which the column address signal changes continuously, and an interleave burst type according to which the column address signal, e.g., of 8 bits changes in the order of 3-2-1-0-7-6-5-4.

Since the above data decides the operation form of SDRAM, initial setting of such data is performed before using the SDRAM. In the third embodiment, the access command is accepted only after an initial operation for storing required data in command register 82 is performed.

In FIG. 5A, a mode set command decoder circuit 43 is formed of a 3-input NAND circuit receiving internal control signals RAS0, CAS0 and WE0. A register set operation trigger signal ZMC from set mode command decoder circuit 43 is applied to a command setting control circuit 80. In response to activation of command set operation trigger signal ZMC, command setting control circuit 80 couples command register 82 to an external terminal 84 to execute writing of data into command register 82. External terminal 84 may include only a data I/O terminal, or may include an address input terminal. Usually, in the operation of setting a mode, a type of mode to be set is determined in accordance with the address signal applied to this particular address signal terminal. A structure of a portion for determining the mode is not shown in the figure for simplicity. When necessary data is to be stored in command register 82, mode set operation trigger signal ZMC is activated.

Figure 5B:
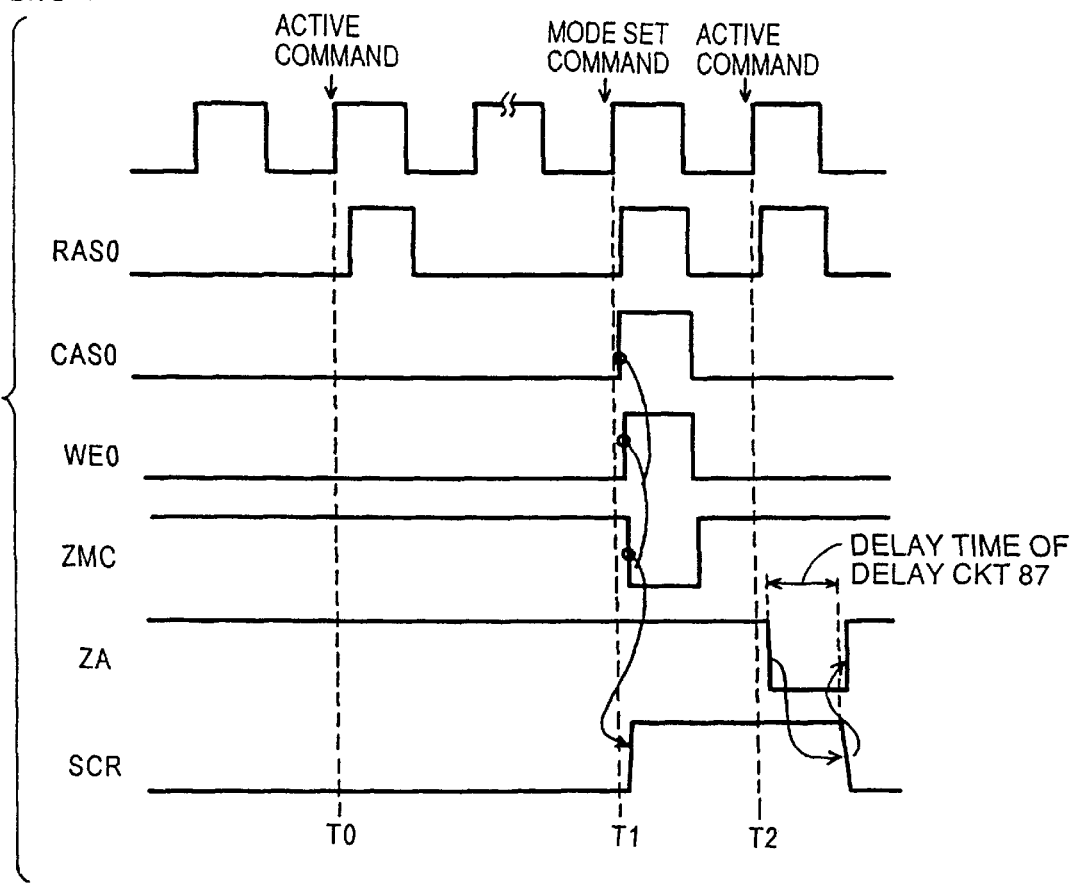
FIG. 5B is a timing chart representing an operation thereof.

Access-command decoder circuit 41a is formed of a 4-input NAND circuit receiving internal control signals RAS0, ZCAS0 and ZWE as well as a command register data setting completion signal SCR. Command register data setting completion signal SCR is applied from an output Q of set/reset flip-flop 85 which is set in response to activation of mode set operation trigger signal ZMC. Set/reset flip-flop 85 receives on its reset input R a signal from a delay circuit 87 which delays internal operation activation trigger signal ZA by a predetermined time. Now, operation of a structure shown in FIG. 5A will be described below with reference to a timing chart shown in FIG. 5B.

When the access command is applied at time T3, internal control signal RAS0 is set to H-level, and internal control signals CAS0 and WE0 are held at L-level. Since command register 82 has not stored necessary data, command register data setting completion circuit SCR is at L-level, and internal operation activation trigger signal ZA is at H-level. In this state, therefore, the internal operation for memory cell selection is not executed.

When the mode set command is applied at time T1, internal control signals RAS0, CAS0 and WE0 are set to H-level (mode set command holds all external control signals extZRAS, extZCAS and extZWE at L-level: corresponding to a normal WCBR--condition). Thereby, mode set operation trigger signal ZMC from mode set command decoder circuit 43 is set to L-level for a predetermined period, set/reset flip-flop 85 is set, and signal SCR is set to H-level. In accordance with this mode set command, command setting control circuit 80 is activated, and the necessary data applied to external terminal 84 is written into command register 82. Even after the necessary data has been written into command register 82, flip-flop 85 is at the set state, and command register data write completion signal SCR maintains H-level.

When active command is applied at time T2, internal control signal RAS0 is set to H-level, and both internal control signals CAS0 and WE0 are held at L-level. Therefore, all the inputs of active command decoder circuit 41a is set to H-level, and internal operation activation trigger signal ZA is set to the active state of L-level. In accordance with activated trigger signal ZA, the internal operation starts, although a path for this is not shown in FIG. 5A. After the delay time determined by delay circuit 87 elapses after falling of trigger signal ZA to L-level, the output signal of delay circuit 87 falls to L-level, set/reset flip-flop 85 is reset, signal SCR is set to L-level, and internal operation activation trigger signal ZA is set to H-level.

In the arrangement of FIG. 5A, the signal SCR goes low once the signal ZA is made active. Thus, mode set command is required to be input before each application of the active command is a normal mode of operation. This deficiency could be solved by the arrangement shown by a dotted circled block. Additional delay circuit receiving the output of delay circuit 87, and an AND gate receiving the output of the additional delay circuit and the signal ZMC. The output of AND gate is supplied to the set input S. According to this arrangement, after the mode set command is once supplied, the signal SRC maintains active to allow the acceptance of the active command.

Owing to the above structure in which the active command is accepted only after initial setting of the data required for command register 82, it is possible to prevent malfunction of the SDRAM, and the SDRAM can be ensured of a high reliability. If the access command were applied before initial setting of the command register 82, the conventional SDRAM would not operate accurately, so that necessary data would not be obtained, and the SDRAM would operate in an unstable state. By the structure described above, however, the operation in an unstable state can be prevented, and thus it is possible to achieve not only improvement of the reliability but also reduction of the current consumption.

[Embodiment 4]

Figure 6:
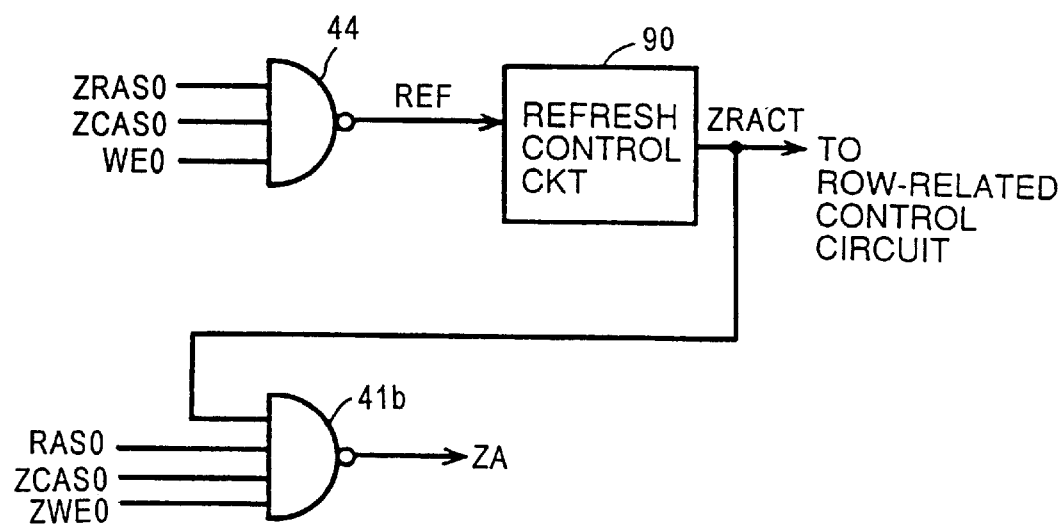
FIG. 6 schematically shows a structure of a main portion of an SDRAM according to a fourth embodiment of the invention.

FIG. 6 shows a structure of a main portion of an SDRAM according to the fourth embodiment of the invention. In FIG. 6, acceptance of the active command is inhibited when an auto-refresh command is applied. An auto-refresh command decoder circuit 44 is formed of a 3-input NAND circuit receiving internal control signals ZRAS0, ZCAS0 and WE0. A refresh operation trigger signal REF from auto-refresh command decoder circuit 44 is applied to a refresh control circuit 90. In response to activation of refresh operation trigger signal REF, refresh control circuit 90 generates a refresh operation activating signal RACT, which is kept active for a predetermined period, to a row-related control circuit. The row-related control circuit is activated in response to refresh operation activating signal RACT, and executes the operation of selecting a row of memory cells, similar to row selection operation in the normal operation. In this case, a memory cell row is selected in accordance with a refresh address from a not shown refresh address counter. An active period of refresh operation activating signal RACT is determined in advance.

Active command decoder circuit 41b is formed of a 4-input NAND circuit which receives refresh operation activating signal ZRACT as well as internal control signals RAS0, ZCAS0 and ZWE0. While the refreshing is being performed internally, refresh operation activating signal ZRACT is active and thus at L-level, and internal operation activation trigger signal ZA from active command decoder circuit 41b is fixed at H-level. Therefore, even if the active command is externally applied, this active command is not accepted, so that change of the output of active command decoder circuit 41a is prevented, and unnecessary circuit operation is prevented.

When auto-refreshing is completed, refresh operation activating signal ZRACT returns to H-level. Thereby, when the active command is externally applied, internal operation activation trigger signal ZA is set to L-level for a predetermined period in accordance with this active command.

The first thru fourth embodiments may be employed independently from each other, or may be used in appropriate combination with each other.

According to the fourth embodiment, as described above, since acceptance of the active command is inhibited while the auto-refreshing is being internally performed, it is possible to prevent unnecessary circuit operation of the active command decoder circuit, and thus it is possible to reduce the power consumption and prevent malfunction due to the unnecessary circuit operation.

[Embodiment 5]

Figure 7:
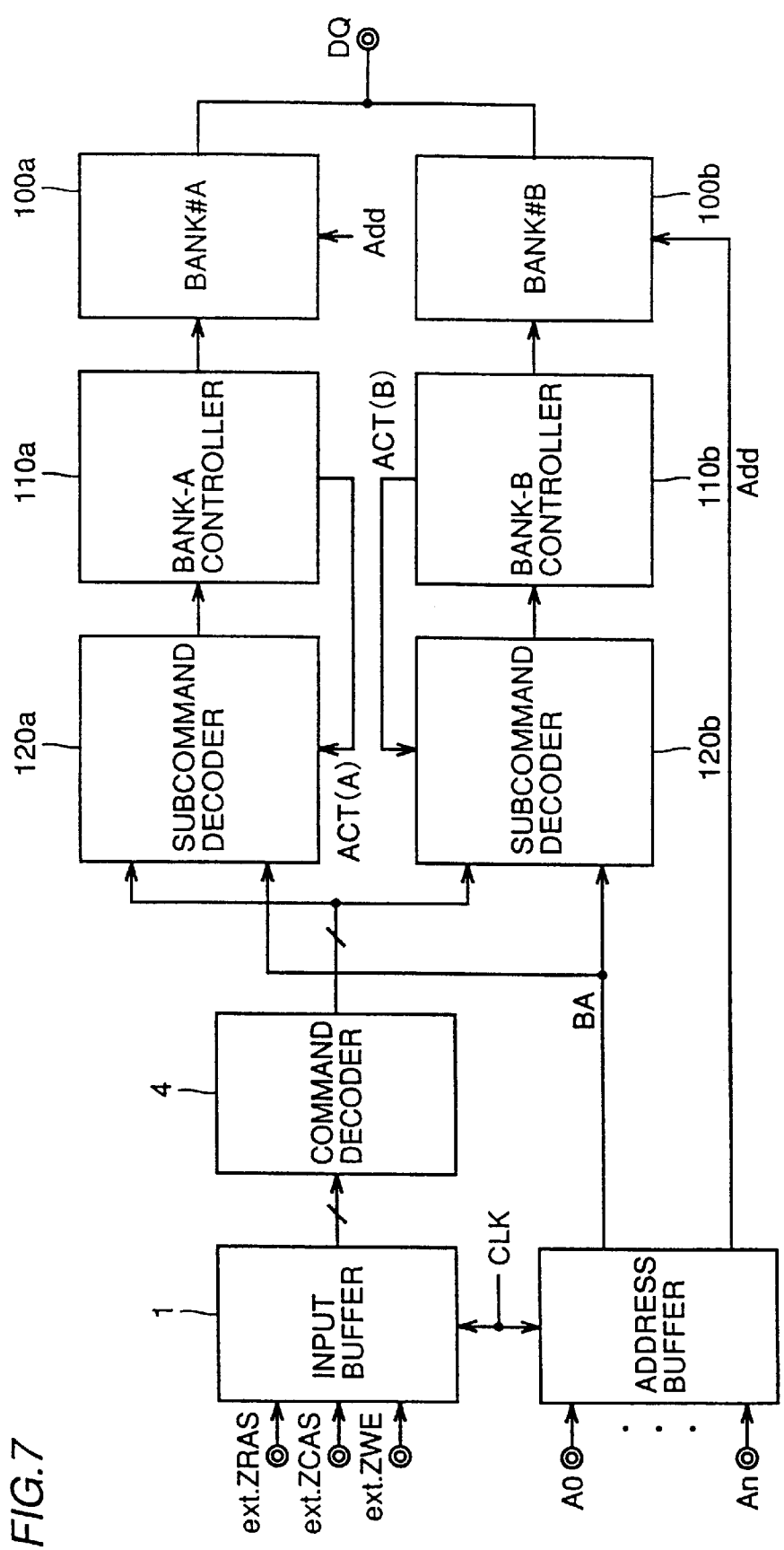
FIG. 7,,schematically shows a whole structure of an SDRAM according to a fifth embodiment of the invention.

FIG. 7 schematically shows a whole structure of an SDRAM according to a fifth embodiment of the invention. In FIG. 7, the SDRAM includes a plurality of (two in FIG. 7) banks #A and #B in which activation/precharge can be individually and independently performed. Each of banks #A and #B includes memory cell array 50, row select circuit 54, column select circuit 56, sense amplifier and I/O block 58 and I/O circuit 60, which are similar to those shown in FIG. 1, respectively, except for the portion of I/O circuit 60 in which the I/O buffer is directly connected to the data I/O terminal. Usually, in the SDRAM, data is temporarily stored in a register (write or read register), and is externally input/output via an I/O buffer in synchronization with clock signal CLK. Operations other than the control of register portions are executed for banks #A and #B independently from each other.

A bank-A controller 110a and a bank-B controller 110b are separately provided for driving banks #A 100a and #B 100b independently from each other. Sub-command decoders 120a and 120b are provided for bank-A controller 110a and bank-B controller 110b, respectively. Each of sub-command decoders 120a and 120b is selectively activated to receive the trigger signal from command decoder 4 in accordance with a bank address BA applied from address buffer 52, and transmits the trigger signal to the corresponding bank controller when selected. Command decoder 4 and input buffer 1 in this embodiment have the same structures as those in the first thru fourth embodiments. Address buffer 52 takes in externally applied address signal bits A0–An in synchronization with clock signal CLK, and produces bank address BA and an internal address signal Add therefrom. Address signal Add is applied to each of bank #A 100a and bank #B 100b. Structures similar to those already described in connection with the previous embodiments are provided in command decoder 4 and sub-command decoders 120a and 120b. Thus, the trigger signal is activated only when a command valid for the corresponding bank is applied.

Figure 8:
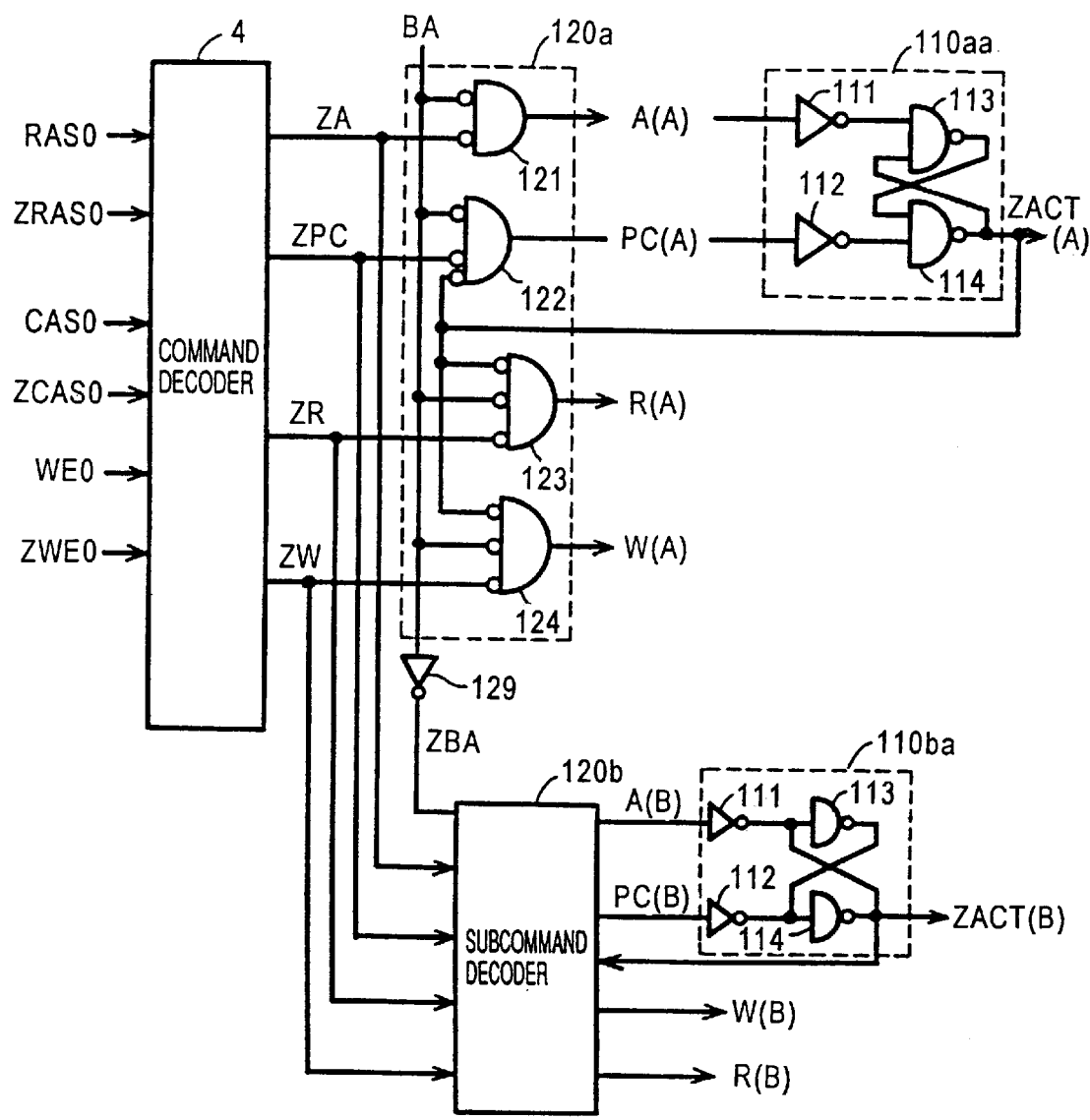
FIG. 8 schematically shows a structure of a main portion of the SDRAM according to the fifth embodiment of the invention.
Figure 14:
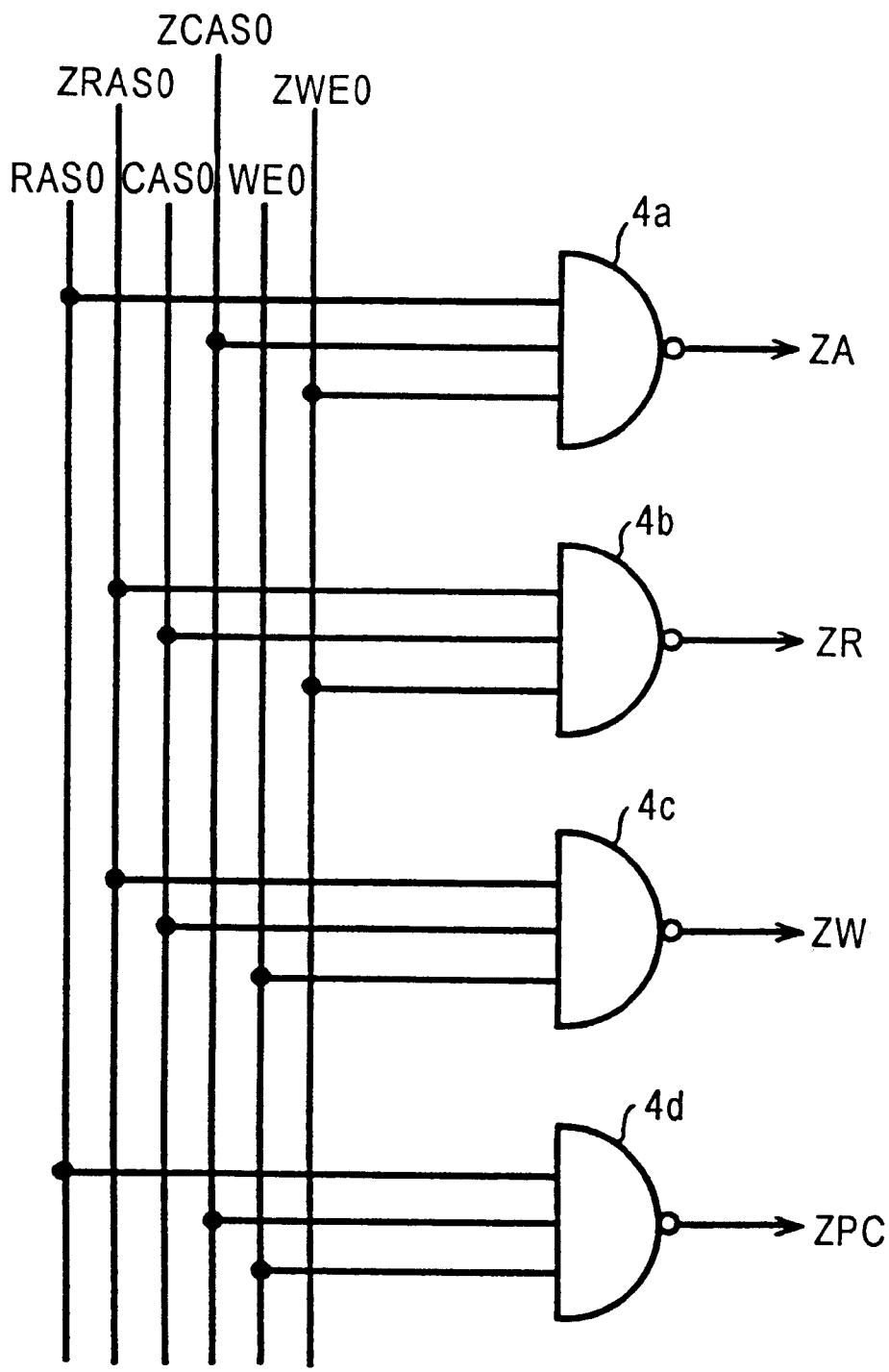
FIG. 14 schematically shows a structure of a command decoder in the conventional SDRAM.

FIG. 8 shows structures of the command decoder, sub-command decoder and bank controller shown in FIG. 7. Command decoder 4 has the same structure as those in the embodiments 1 to 4, and has the same internal structure as the decoder illustrated in FIG. 14. In accordance with internal control signals RAS0, ZRAS0, CAS0, ZCAS0, WE0 and ZWE0 applied from input buffer circuit 1, command decoder 4 activates internal operation activation trigger signal ZA, precharge operation activation trigger signal ZPC, read operation trigger signal ZR and write operation trigger signal ZW for a predetermined period. Sub-command decoder 120a includes an active command decoder 121 formed of a 2-input NOR circuit receiving bank address signal bit BA and internal operation activation trigger signal ZA, a precharge command decoder circuit 122 formed of a 2-input NOR circuit receiving bank address signal bit BA and precharge operation trigger signal ZPC, a read command decoder circuit 123 formed of a 3-input NOR circuit receiving active signal ACT(A), which is applied from an internal activating circuit 110aa included in bank-A controller 110a to be described later, as well as bank address signal bit BA and read operation trigger signal ZR, and a write command decoder circuit 124 formed of a 3-input NOR circuit receiving active signal ACT(A), bank address signal bit BA and write operation trigger signal ZW.

Internal activating circuit 110aa includes an inverter 111 receiving an internal operation activation trigger signal A(A) from active command decoder circuit 121, an inverter 112 receiving a precharge operation trigger signal PC(A) from precharge command decoder circuit 122, an NAND circuit 113 receiving on one of its two inputs the output signal of inverter 111, and an NAND circuit 114 receiving on one of its inputs the output signal of inverter 112. NAND circuit 114 generates active signal ACT(A) activating bank #A 100a (starting the memory cell selection operation). Active signal ACT(A) is also applied to the other input of NAND circuit 113. The output signal of NAND circuit 113 is fed back to the other input of NAND circuit 114.

Sub-command decoder 120b provided for bank #B 100b has the same structure as sub-command decoder 120a except for that it receives the bank address signal bit Bt via an inverter 129. Sub-command decoder 120b is selected when inverted bank address signal bit ZBA applied via inverter 129 is at L-level, and supplies trigger signals for bank #B 100b corresponding to trigger signals ZA, ZPC, ZR and ZW applied from command decoder 4, i.e., precharge operation trigger signal PC(B), internal operation activation trigger signal A(B), write operation trigger signal W(B) and read operation trigger signal R(B) for bank #B.

Similarly, bank #B controller 110b includes an internal activating circuit 110ba, which generates active signal ACT (B) for bank #B in accordance with precharge operation trigger signal PC(B) and internal operation activation trigger signal A(B). Internal activating circuit 110ba has the same structure as internal activating circuit 110aa, and includes inverters 111 and 112 as well as NAND circuits 113 and 114. Active signal ACT(B) for bank #B 100b is also applied to sub-command decoder 120b to suppress generation of write operation trigger signal W(B) and read operation trigger signal R(B) for bank #B. Operation of the command decoder and sub-command decoders shown in FIG. 8 will be described below with reference to a timing chart of FIG. 9.

Figure 9:
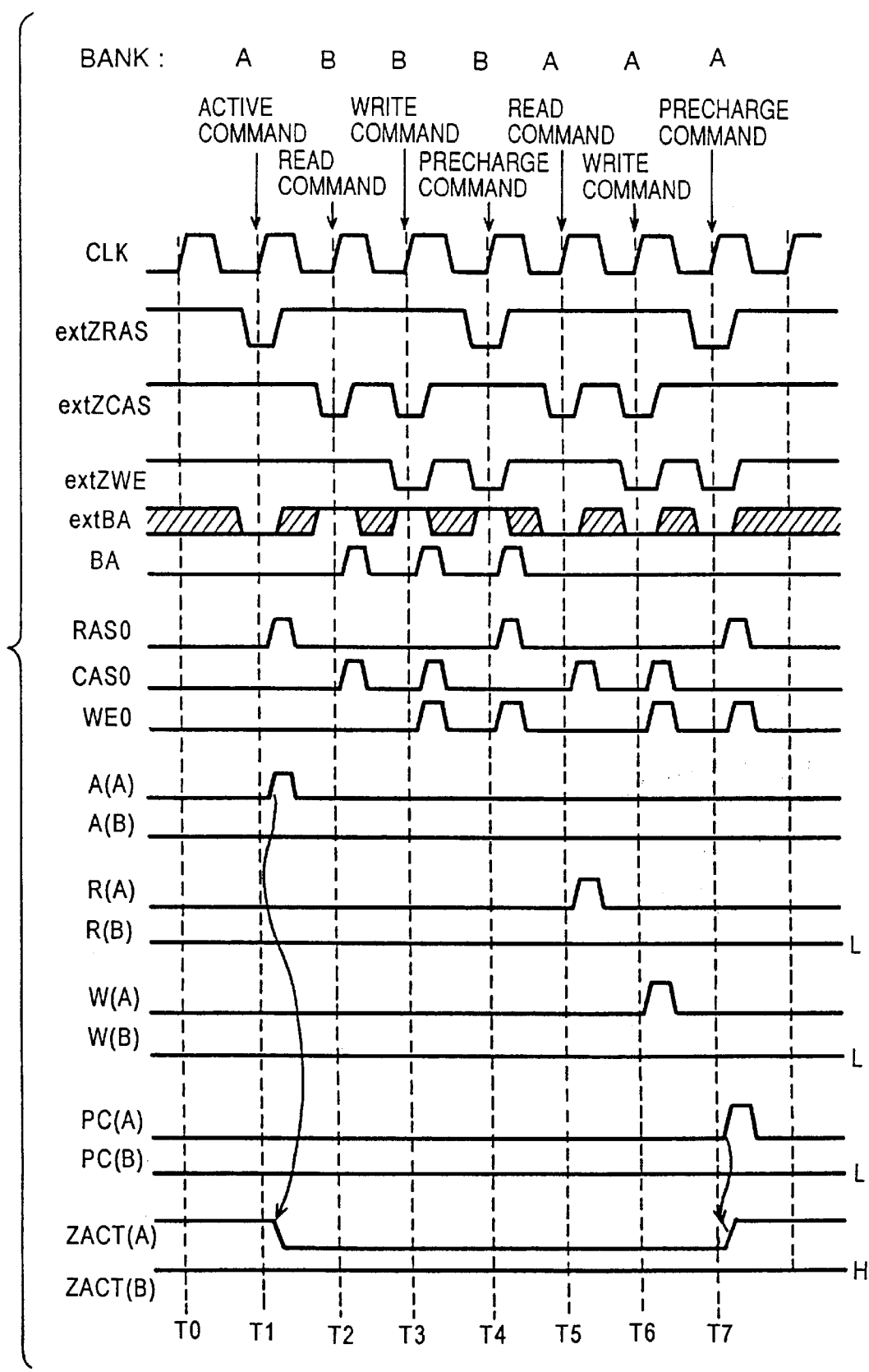
FIG. 9 is a timing chart representing an operation of the SDRAM according to the fifth embodiment of the invention.

At time T0, all external control signals extZRAS, extZCAS and extZWE are held at H-level. In this state, no command is applied, so that the SDRAM maintains the last state. In FIG. 9, the SDRAM is shown to be in the precharge state before time T0. In this state, both active signals ZACT(A) and ZACT(B) are in the inactive state of H-level.

At time T1, the active command is applied. An external bank address extBA is set to L-level, so that bank #A is designated. Thus, the active command for bank #A is applied at time T1. In accordance with the active command for bank #A, internal operation activation trigger signal A(A), which is generated from active command decoder circuit 121 of sub-command decoder 120a shown in FIG. 8, is set to the active state of H-level for a predetermined period, the output signal of NAND circuit 113 of internal activating circuit 110aa is set to H-level, and thus active signal ZACT(A) is set to the active state of L-level. Thereby, the memory cell select operation starts for bank #A.

At time T2, the read command for bank #B is applied. In this state, bank address BA is at H-level, and all the trigger signals for bank #A from sub-command decoder 120a are at the inactive state of L-level. Meanwhile, in sub-command decoder 120b provided for bank #B, bank address signal ZBA is set to L-level and thus enabled. However, active signal ZACT(B) from internal activating circuit 110ba is at H-level, and the sub-read command decoder circuit for bank #B is still disabled. Therefore, read operation trigger signal R(B) maintains the inactive state of L-level. Thereby, the read operation for bank #B is inhibited.

At time T3, the write command for bank #B is applied. In this state, active signal ZACT(B) for bank #B is still at H-level and thus inactive, sub-command decoder 120b of bank #B is disabled (inactive), and write operation trigger signal W(B) maintains the inactive state of L-level.

The precharge command for bank #B is applied at time T4. In this state, even if precharge operation trigger signal ZPC from command decoder 4 is active and thus at L-level for a predetermined period, sub-command decoder 120b of bank #B is inactive because active signal ZACT(B) is inactive, so that precharge operation trigger signal PC(B) maintains the inactive state of L-level.

The read command for bank #A is applied at time T5. In this state, sub-command decoder 120a activates read operation trigger signal R(A) to H-level in response to falling of trigger signal ZR applied from command decoder 4, and data read operation is executed in bank #A.

The write command is applied to bank #A at time T6. In this state, internal activating signal ZA(A) is at L-level and thus active, and sub-command decoder 120a activates write operation trigger signal W(A) for bank #A to H-level in response to activation of write operation trigger signal ZW applied from command decoder 4.

When the precharge command for bank #A is applied at time T7, precharge operation trigger signal PC(A) from sub-command decoder 120a is activated to attain H-level similarly to the above. In response to activation of precharge operation trigger signal PC(A), internal activating circuit 110aa is reset, and active signal ZACT(A) is deactivated to attain H-level.

As described above, the sub-command decoders are provided for the respective banks, and the commands (read, write and precharge commands) other than the active command are ignored if they are applied before the active command for the corresponding bank is applied. Therefore, unnecessary circuit operation can be prevented.

This fifth embodiment is constructed to accept any of the read, write and precharge commands only when the corresponding bank is active (i.e., when the active command is applied, and the active signal ZACT is active). However, such a structure may be employed that only one or two of the read, write and precharge commands are accepted only when the corresponding bank is active.

According to the fifth embodiment of the invention, as described above, the read, write and precharge commands only for the bank for which the active command is supplied are accepted as a valid command, so that unnecessary circuit operation is prevented, and it is possible to reduce power consumption and prevent circuit malfunction.

[Embodiment 6]

Figure 10:
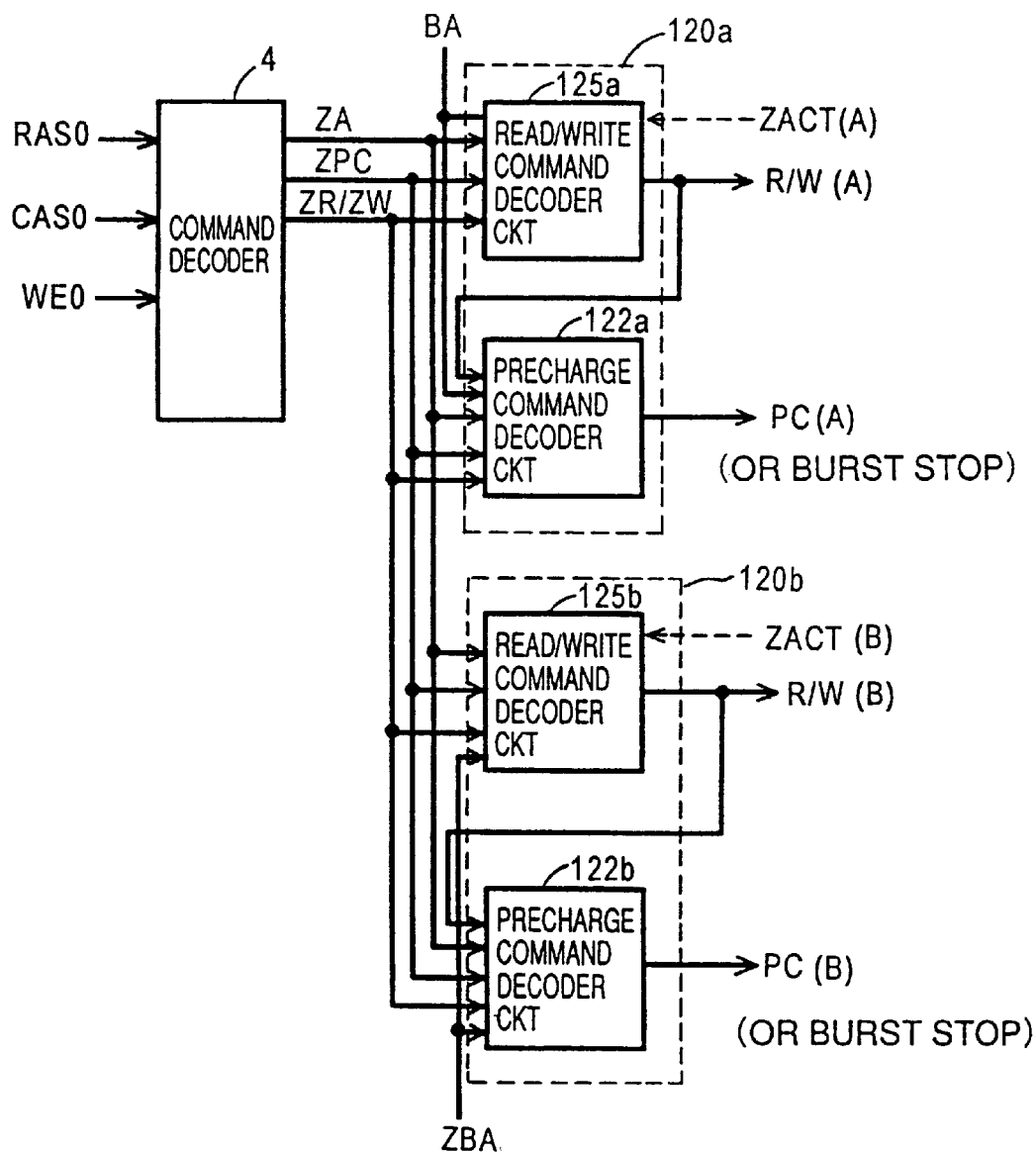
FIG. 10 schematically shows a structure of a main portion of an SDRAM according to a sixth embodiment of the invention.
Figure 11:
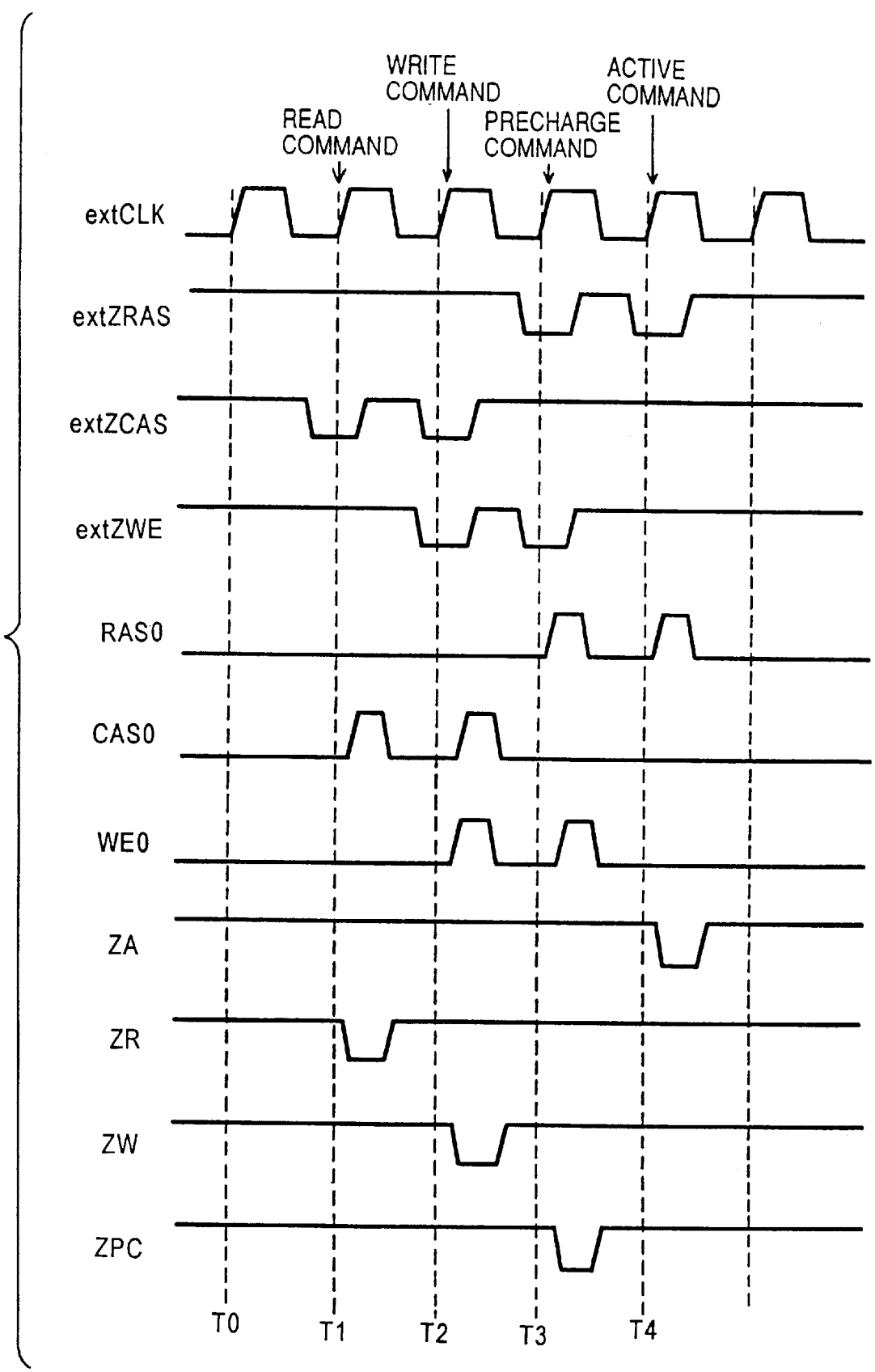
FIG. 11 is a timing chart representing an operation of a conventional SDRAM.

FIG. 10 shows a structure of a main portion of an SDRAM according to a sixth embodiment of the invention. In the structure shown in FIG. 10, a precharge command decoder circuit 122a in sub-command decoder 120a provided for bank #A is enabled in accordance with activation of a signal R/W(A) from a read/write command decoder circuit 125a which in turn decodes the read and write commands. Similarly, a precharge command decoder circuit 122b in sub-command decoder 120b provided for bank #B is enabled only in accordance with activation of a read/write operation activating signal R/W(B) sent from a read/write command decoder circuit 125b which in turn decodes the read and write commands for bank #B.

Activating signals R/W(A) and R/W(B) respectively from read/write command decoder circuits 125a and 125b are generated from flip-flops which are set/reset by the trigger signals already described in connection with the preceding embodiments. This structure is equivalent to a structure in which the structure of the second embodiment is provided for each bank.

In this structure, the precharge command is accepted and the precharge operation is executed only when the read or write operation is performed in the corresponding bank. Therefore, unnecessary circuit operation can be prevented.

The structure shown in FIG. 10 may use a structure, in which read/write command decoder circuit 125a is activated only when active signal ZACT(A) is applied to read/write command decoder circuit 125a and active signal ZACT(A) is active as represented by broken line, similarly to the preceding embodiment. Also, read/write command decoder circuit 125b may be supplied with active signal ZACT(B) for bank #B. Read/write command decoder circuits 125a and 125b may be constructed to perform decoding regardless of the states of active signals ZACT(A) and ZACT(B), respectively.

In the sixth embodiment, a burst stop command which interrupts continuous reading of or continuous writing of data may be used instead of the precharge command. This burst stop command may be adapted to be valid only when the read or write command is applied to the corresponding bank.

In FIG. 10, a trigger signal ZR/ZW from command decoder 4 represents both of a read operation trigger signal ZR and a write operation trigger signal ZW.

According to the sixth embodiment of the invention, as described above, the sub-command decoders are provided for the respective banks, and the precharge command is validated to perform the precharging only when the read or write command is applied for the corresponding bank. Therefore, unnecessary circuit operation can be prevented, and it is possible to reduce a power consumption and prevent malfunction of circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous dynamic random access memory device comprising:

a plurality of memory cells;

a first command decoder for receiving and determining states of a plurality of external control signals applied externally in synchronization with a clock signal externally applied periodically and repetitively, and generating an activating signal activating a memory cell select operation for selecting memory cells among said plurality of memory cells when a first combination of states of said plurality of external control signals is found; and a second command decoder enabled in response to activation of the activating signal from said first command decoder to determine the states of said plurality of external control signals applied in synchronization with said clock signal and activate an internal operation different from said memory cell select operation when a second combination of states of the external control signals different from said first combination of states is found, said second command decoder being disabled in response to inactivation of said activating signal.

2. The synchronous random access memory device according to claim 1, wherein said second command decoder activates an operation of outputting or inputting data from or into the selected memory cells as said internal operation.

3. The synchronous random access memory device according to claim 1, wherein said second command decoder activates an operation of placing the selected memory cells to a non-selected state as said internal operation.

4. The synchronous random access memory device according to claim 1, wherein said second command decoder includes a negative logical product gate receiving the external control signals and said activating signal from the first command decoder.

5. The synchronous random access memory device according to claim 1, wherein said first command decoder comprises a flip-flop set when said first combination of states is found, for generating said activating signal.

6. The synchronous random access memory device according to claim 3, wherein said first command decoder comprises a flip-flop set when said first combination is found and reset when said second combination is found by the second command decoder.

7. The synchronous random access memory device according to claim 1, wherein said plurality of memory cells are grouped into a plurality of banks, the memory select operation in said plurality of banks being performed independently of each other, and wherein said first command decoder is provided for each respective bank.

8. A synchronous dynamic random access memory device comprising:

a command decoder receiving a plurality of external control signals applied in synchronization with a clock signal applied periodically and repetitively, to determine a combination of states of the received control signals for generating an operation mode designating signal in accordance with the result of determination; and a sub command decoder coupled to said command decoder, for generating an internal operation activating signal for activating an internal operation designated by said operation mode designating signal, said sub command decoder including prohibition means responsive to a first internal operation activating signal for activating a first internal operation, for prohibiting generation of a second internal operation activating signal for activating a second internal operation activating signal different from said first internal operation when said first internal operation activating signal is inactive.

9. The synchronous random access memory device according to claim 8, further comprising a plurality of banks each having a plurality of memory cells each storing information, memory select operation in said plurality of banks being performed independently of each other, wherein said command decoder is provided in common to said plurality of banks, and said sub command decoder is provided for each respective bank, each said sub command decoder being enabled in response to designation of a corresponding bank by a bank address signal specifying a bank.

10. The synchronous dynamic random access memory device according to claim 8, wherein said sub command decoder comprises, first sub command decode circuitry for generating said first internal operation activating signal when said operation mode designating signal designates said first internal operation, and second sub command decode circuitry enabled in response to generation of said first internal operation activating signal for generating said second internal operation activating signal when said operation mode designating signal designates said second internal operation.

11. The synchronous dynamic random access memory device according to claim 10, further comprising a plurality of dynamic type memory cells, wherein said first internal operation activating signal activates a memory cell select operation for selecting memory cells among said plurality of dynamic type memory cells.

12. The synchronous dynamic random access memory device according to claim 11, wherein said first sub command decode circuitry comprises a latch for latching said first internal operation activating signal.

13. A synchronous random access memory device comprising:

a plurality of memory cells storing data a first command decoder for decoding a plurality of external control signals applied in synchronization with a clock signal externally, periodically and repetitively applied to activate a refresh instruction signal instructing a refreshing operation of storage data in the memory cells in accordance with the result of decoding;

a refresh controller responsive to said refresh instruction signal for generating a refresh operation activation signal activating the refresh operation; and a second command decoder enabled in response to inactivation of said refresh operation activation signal, for decoding the external control signals to activate an active signal activating a memory cell selection operation in accordance with the result of decoding.

14. The synchronous random access memory device according to claim 13, wherein said second command decoder is disabled to be inhibited from performing an operation of decoding when said refresh operation activation signal is made active.

15. The synchronous dynamic random access memory device according to claim 1, wherein said activating signal is activated when generated.

16. The synchronous random access memory device according to claim 13, wherein said refresh operation activating signal is activated when generated.

* * * * *